United States Patent
Shumarayev et al.

(10) Patent No.: US 7,539,278 B2
(45) Date of Patent: May 26, 2009

(54) PROGRAMMABLE TRANSCEIVERS THAT ARE ABLE TO OPERATE OVER WIDE FREQUENCY RANGES

(75) Inventors: Sergey Yuryevich Shumarayev, San Leandro, CA (US); Rakesh Patel, Cupertino, CA (US)

(73) Assignee: Altera Corporation, San Jose, CA (US)

( * ) Notice: Subject to any disclaimer, the term of this patent is extended or adjusted under 35 U.S.C. 154(b) by 587 days.

(21) Appl. No.: 11/292,565

(22) Filed: Dec. 2, 2005

(65) Prior Publication Data

US 2007/0127616 A1    Jun. 7, 2007

(51) Int. Cl.
    H03D 3/24    (2006.01)
(52) U.S. Cl. ............... 375/376; 327/147; 327/156
(58) Field of Classification Search ........... 375/219, 375/376; 327/147, 156
    See application file for complete search history.

(56) References Cited

U.S. PATENT DOCUMENTS

| | | | | |
|---|---|---|---|---|
| 4,707,142 A * | 11/1987 | Baker et al. | ............. | 368/46 |
| 4,901,033 A * | 2/1990 | Herold et al. | ............. | 331/1 A |
| 5,072,195 A * | 12/1991 | Graham et al. | ............. | 331/2 |
| 5,579,184 A * | 11/1996 | Nakanishi et al. | ............. | 360/51 |
| 5,710,720 A * | 1/1998 | Algrain et al. | ............. | 700/280 |
| 6,252,444 B1 * | 6/2001 | Lee | ............. | 327/156 |
| 6,327,319 B1 * | 12/2001 | Hietala et al. | ............. | 375/374 |
| 6,349,391 B1 * | 2/2002 | Petivan et al. | ............. | 714/11 |
| 6,650,140 B2 | 11/2003 | Lee et al. | | |
| 6,653,874 B2 * | 11/2003 | Ishikawa | ............. | 327/144 |
| 6,654,898 B1 * | 11/2003 | Bailey et al. | ............. | 713/500 |
| 6,703,876 B2 * | 3/2004 | Fujiwara et al. | ............. | 327/156 |
| 6,993,445 B2 * | 1/2006 | Clarke et al. | ............. | 702/106 |
| 7,042,259 B2 * | 5/2006 | Kurd et al. | ............. | 327/147 |
| 7,124,309 B2 * | 10/2006 | Burns et al. | ............. | 713/300 |
| 7,216,249 B2 * | 5/2007 | Fujiwara et al. | ............. | 713/501 |
| 7,272,677 B1 * | 9/2007 | Venkata et al. | ............. | 710/71 |
| 7,276,936 B1 * | 10/2007 | Hoang et al. | ............. | 326/41 |
| 7,290,156 B2 * | 10/2007 | Gaskins | ............. | 713/322 |
| 7,290,161 B2 * | 10/2007 | Kahn | ............. | 713/500 |
| 7,308,592 B2 * | 12/2007 | Schmunkamp et al. | ...... | 713/400 |
| 7,313,176 B1 * | 12/2007 | Groen | ............. | 375/219 |
| 7,366,267 B1 * | 4/2008 | Lee et al. | ............. | 375/354 |
| 2002/0073351 A1 * | 6/2002 | Oh | ............. | 713/500 |
| 2003/0085734 A1 * | 5/2003 | Nguyen | ............. | 326/46 |
| 2006/0001494 A1 * | 1/2006 | Garlepp et al. | ............. | 331/2 |
| 2006/0006918 A1 * | 1/2006 | Saint-Laurent | ............. | 327/295 |

* cited by examiner

*Primary Examiner*—Jean B Corrielus
(74) *Attorney, Agent, or Firm*—Brian E. Mack; Ropes & Gray LLP (57) ABSTRACT

A field-programmable gate array ("FPGA") may include data receiver and/or transmitter circuitry that is adapted to receive and/or transmit data at any frequency(ies) or data rate(s) in a wide range of possible frequencies or data rates. Phase-locked loop (PLL) circuitry may be needed for operation of such receiver and/or transmitter circuitry. For satisfactory operation over the wide frequency range, multiple PLL circuits are provided. One of these PLL circuits may be capable of operating over the entire frequency range, possibly with better jitter performance in some portions of the range than in other portions of the range. One or more other PLL circuits may be provided that are focused on particular parts of the broad range, especially where the jitter performance of the first-mentioned PLL may not be adequate to meet some possible needs.

24 Claims, 9 Drawing Sheets

PROGRAMMABLE TRANSCEIVERS THAT ARE ABLE TO OPERATE OVER WIDE FREQUENCY RANGES

BACKGROUND OF THE INVENTION

This invention relates to field-programmable gate arrays ("FPGAs"), such as those of the type known as programmable logic devices ("PLDs"). More particularly, the invention relates to transceiver circuitry for inclusion in such devices.

For convenience herein, all programmable integrated circuit devices to which the invention can be applied will be referred to as FPGAs.

A frequent objective in the manufacture of FPGAs is to give the device a wide range of operating capabilities so that the FPGA can meet the various needs of many different users and thereby create a large market for the FPGA product. In general, the larger the market, the lower the unit cost the FPGA can have. On the other hand, giving an FPGA too many capabilities puts upward pressure on unit cost, so it is necessary to strike a balance between a set of capabilities that is large enough to make the product widely usable, without providing such an excess of capabilities that unit cost begins to adversely impact sales volume.

In recent years sophisticated transceiver circuitry has been added to many FPGAs. For example, such transceiver circuitry may be used to support high-speed serial data communication to and/or from the FPGA. Such circuitry may sometimes be referred to as high-speed serial interface ("HSSI") circuitry. This circuitry may include some components that are hard-wired or partly hard-wired to perform particular transceiver tasks. Certain aspects of these components or their operation may be programmable. The transceiver circuitry on an FPGA typically communicates with the "core" (i.e., the basic programmable logic circuitry) of the FPGA. Examples of HSSI circuitry on FPGAs are shown in Lee et al. U.S. Pat. No. 6,650,140.

Data rates are constantly increasing, and so there is constant interest in increasing the data rates that FPGA transceivers can support. On the other hand, many FPGA users continue to be interested in using lower date rates. This creates a demand for FPGA transceivers that can operate over a very wide range of frequencies (e.g., from the relatively slow frequencies that were developed some time ago to the much higher frequencies that are at the constantly advancing leading edge). For example, it might be desirable for FPGA transceiver circuitry to be able to support data rates from 622 Mbps to 12 Gbps (i.e., from 622 mega-bits per second to 12 giga-bits per second). Moreover, it might be desirable for the FPGA transceiver circuitry to be able to support any or substantially any data rate within this range. (It will be understood that all data rates and/or frequencies mentioned herein are only examples, and that the invention is not limited to any particular data rates, range of data rates, frequencies, or range of frequencies.)

SUMMARY OF THE INVENTION

In accordance with this invention, PLL circuitry for an FPGA that may be called upon to support data reception and/or transmission at any frequency(ies) or data rate(s) in a wide range of such frequencies or data rates includes several separate PLL circuits. A first of these PLL circuits is able to operate at any frequency in the above-mentioned wide range. At some frequencies in that wide range, the jitter performance of the first PLL circuit may be better than at other frequencies in that range. For example, this jitter performance may be better at lower frequencies in the wide range than at higher frequencies in that range. One or more additional PLL circuits are provided for use where the jitter performance of the first PLL circuit may not be adequate in particular applications. For example, the operating range of an additional PLL circuit may be relatively narrow but may cover a portion or portions of the wide range where the jitter performance of the first PLL circuit may not be adequate.

The different PLLs may have different constructions. For example, the wide-range PLL may be a ring-based PLL, while a narrower-range PLL may be an LC-tank-based PLL.

A PLL may be augmented with optionally usable, downstream, frequency divider circuitry to give the PLL additional portions of the wide range in which it can operate with good jitter performance.

Separate reference clock sources may be provided for each separate PLL.

A PLL that is not needed in a particular application may be turned off to save power. This may be done programmably, and can also apply to circuitry related to the PLL, which related circuitry is also not needed when the PLL is not needed. Turning off the power to a PLL can be especially helpful in the case of a wide-range PLL because such PLLs tend to use more power. This is so because a wide-range PLL must be able to meet the highest data rate specified for that PLL. This penalizes users who do not require the PLL to operate near its maximum data rate because PLL power does not follow reduction in data rate, but stays relatively constant regardless of the data rate actually used.

Further features of the invention, its nature and various advantages will be more apparent from the accompanying drawings and the following detailed description.

DETAILED DESCRIPTION

Figure 1:
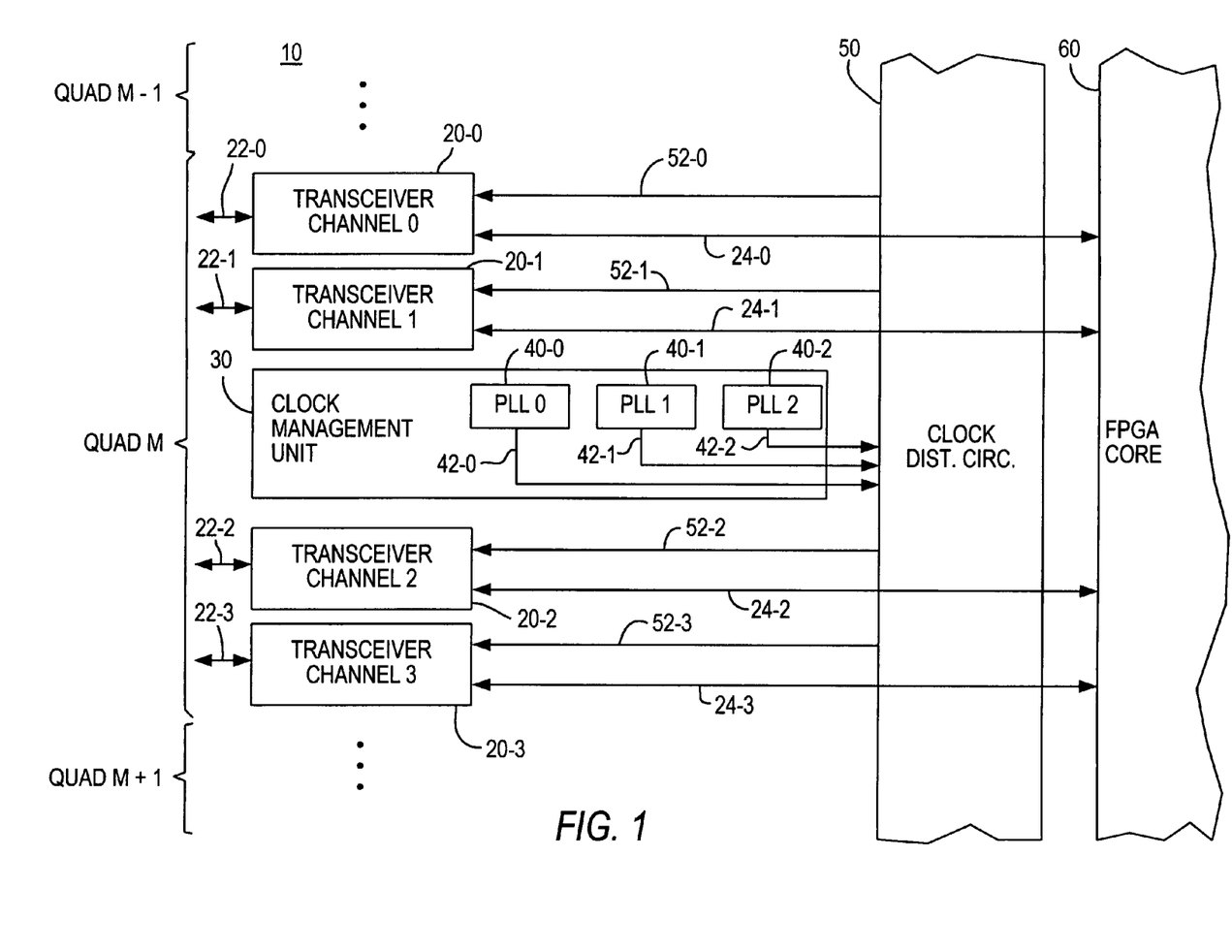
FIG. 1 is a simplified block diagram showing an illustrative embodiment of the invention.

As shown in FIG. 1, illustrative FPGA 10 includes several "quads" of HSSI circuitry M−1, M, and M+1, etc. The number of such quads that may be included in any particular FPGA product is entirely optional. For example, an FPGA may include one quad, two quads, four quads, five quads, or any other desired number of quads. In the following discussion most attention will be given to quad M. It will be understood that quad M is only representative, and that other similar quads (M−1, M+1, etc.) may be included.

Quad M includes four channels of transceiver circuitry 20-0 through 20-3 and one unit of clock management circuitry 30. Circuitry 30 may also be referred to as CMU circuitry 30. Each transceiver channel 20 can handle one in-bound data stream and one out-bound data stream. The connection line 22 associated with each transceiver channel 20 in FIG. 1 may actually represent separate in-bound and out-bound data leads. Moreover, each in-bound and each out-bound data path may actually be a differential signaling path, requiring a pair of leads conveying a pair of differential or complementary signals. Connections 22 typically extend to one or more devices that are external to FPGA 10.

Each transceiver channel 20 can exchange data with FPGA core 60 via the connections 24 associated with that channel. Each connection line 24 typically represents several parallel in-bound connections and several parallel out-bound connections. For example, one of the functions performed by each transceiver channel 20 may be to convert a received (in-bound) serial data signal (from associated in-bound lead(s) 22) to a plurality of parallel data signals 24, each representing (at any given time) a respective one of the bits of a data word received serially by that channel. In other words, on the receiver side, each channel 20 may operate as a serial-to-parallel converter of a received data signal. On the transmitter side, each channel 20 may perform a reverse, parallel-to-serial operation. Thus the connections 24 associated with a channel may include several parallel leads for conveying the bits of out-bound data words in parallel, and the channel may convert that parallel data to serial form that is output via the out-bound serial lead(s) 22 of that channel.

The connections 24 associated with each transceiver channel 20 may also include other types of signals such as clock, status, and control signals. These signals may variously flow in either direction between the channel and FPGA core 60.

An important function that may be performed on the receiver side of any or all of transceiver channels 20 is so-called clock and data recovery ("CDR"). This involves receiving and correctly interpreting a serial data signal without the requirement for an accompanying clock signal that is fully synchronized with the data signal. There may be a reference clock signal having frequency that is related to the bit rate of the data signal, but there is no requirement for any particular phase relationship between transitions in the reference clock signal and the data signal. The CDR circuitry uses transitions in the data to determine the precise bit rate and phase of the data signal. With that information, the CDR circuitry produces a re-timed data signal and a recovered clock signal. The re-timed data signal is the correct interpretation of the originally received serial data signal. It is also a "cleaned-up" version of that signal, and it is fully synchronized (i.e., both phase and frequency) with the recovered clock signal. Accordingly, the re-timed data signal is ready for further processing in further receiver circuitry of the transceiver channel 20 that is handling it. For example, such further processing may include (as an early further step in the associated channel 20) converting the re-timed data signal from serial to parallel form. The recovered clock signal may be used in at least some of the further processing of the re-timed data signal.

To perform its functions (e.g., as described above), the CDR circuitry in each channel may need one or more reference clock signals. These reference clock signals may be different than, but possibly derived or partly derived from, the reference clock signal mentioned in the preceding paragraph. For example, the reference clock signal mentioned in the preceding paragraph may be an input to phase-locked loop ("PLL") circuitry of FPGA 10, and one or more output signals of that PLL circuitry may be the one or more reference clock inputs to the CDR circuitry in one or more of channels 20. Among the purposes of such PLL circuitry may be (1) to "clean up" an applied reference clock signal, (2) to effectively change the reference clock frequency, and (3) to provide multiple phase-shifted versions of the same basic clock signal.

To avoid confusion in the following further discussion, the clock-type output signals of a PLL that are applied to CDR circuitry as described above may be referred to as PLL-to-CDR reference clock signals, PLL-to-CDR clock signals, PLL-to-CDR signals or the like to distinguish them from other reference clock signals such as the reference clock signal mentioned two paragraphs earlier, or the reference clock signal that is an input to a PLL as mentioned one paragraph earlier.

In addition to being needed for CDR operation as described above, PLL output signals may be needed on the transmitter side of one or more of channels 20, e.g., to clock the output of serial data being transmitted by a channel via its out-bound lead(s) 22.

As mentioned in the Background section of this specification, it may be desirable for FPGA 10 to be able to support high-speed serial communication having one or more bit rates that are anywhere (or substantially anywhere) in a wide range of possible bit rates, and which range extends to bit rates that are very high. For any given bit rate, the above-described PLL must be able to operate at a frequency related to the bit rate. The bit rate range over which the HSSI circuitry of FPGA 10 can operate is therefore affected by the frequency range over which the required PLL circuitry can satisfactorily operate.

In accordance with the present invention, the PLL circuitry operating frequency range of FPGA 10 is enhanced by including multiple separate PLL circuits 40 in CMU circuitry 30. In the illustrative embodiment shown in FIG. 1, CMU 30 can provide PLL-to-CDR reference clock signals for the transceiver channels 20 in the quad that includes that CMU circuitry. For example, one or more output signals 42 of each of PLLs 40-0 through 40-2 can be applied to any one or more of channels 20-0 through 20-3 via clock distribution circuitry 50 and leads 52. Circuitry 50 is preferably programmable to select which of PLL output signals 42 will be applied to which of leads 52 and therefore to which of transceiver channels 20.

Consider a quad that has to operate in the range from 622 Mbps to 12 Gbps. It might be possible to create ring-based CDR circuitry that would meet such a wide data range. However, it is much more difficult to create a clean CMU PLL to support this data range. This is because a CMU PLL has (and needs to have) a very stringent jitter specification to satisfy the requirements of many possible uses, and meeting this specification at the highest data rate does not produce an optimal system. The possible alternative of an LC tank oscillator circuit could yield poorly performing and not very functional tank circuitry. For example, an LC tank oscillator circuit may have relatively low jitter and be capable of operation at very high frequencies, but may have a relatively narrow operating frequency range.

The present invention solves the foregoing problem in the following manner. PLL0 40-0 is a wide-range, ring-based PLL that preferably covers a complete frequency range such as 622 Mbps to 12 Gbps. PLL0 40-0 may have relatively poor jitter performance at its higher end. However, the possible significance of this is greatly diminished by the provision of additional PLLs 40-1 and 40-2, either of which can be used as an alternative to PLL0 40-0.

PLL1 40-1 may be a narrow-band PLL (ring or LC) focused on optimal jitter from about 8 Gbps to about 10 Gbps. PLL2 40-2 may also be a narrow-band PLL (most likely LC) focused on jitter from about 9.95 Gbps to about 12 Gbps.

The above-described combination of a wide-range, ring-based PLL and at least one narrow-range LC-tank-based PLL can be performance-optimized vs. trying to rely solely on one wide-range ring oscillator PLL. (Any attempt to produce a wide-range LC tank PLL would probably result in unacceptable jitter.) The provision of multiple separate PLLs also permits at least some of these PLLs to be targeted to particular data ranges that may be of particular importance and/or that may have particular requirements (e.g., with respect to maximum permissible jitter). This can include providing particularly desirable, separate, reference clock signals for each PLL (or for at least some one or more of the PLLs) in the manner shown, for example, in FIG. 6 and described in more detail below.

Figure 2:
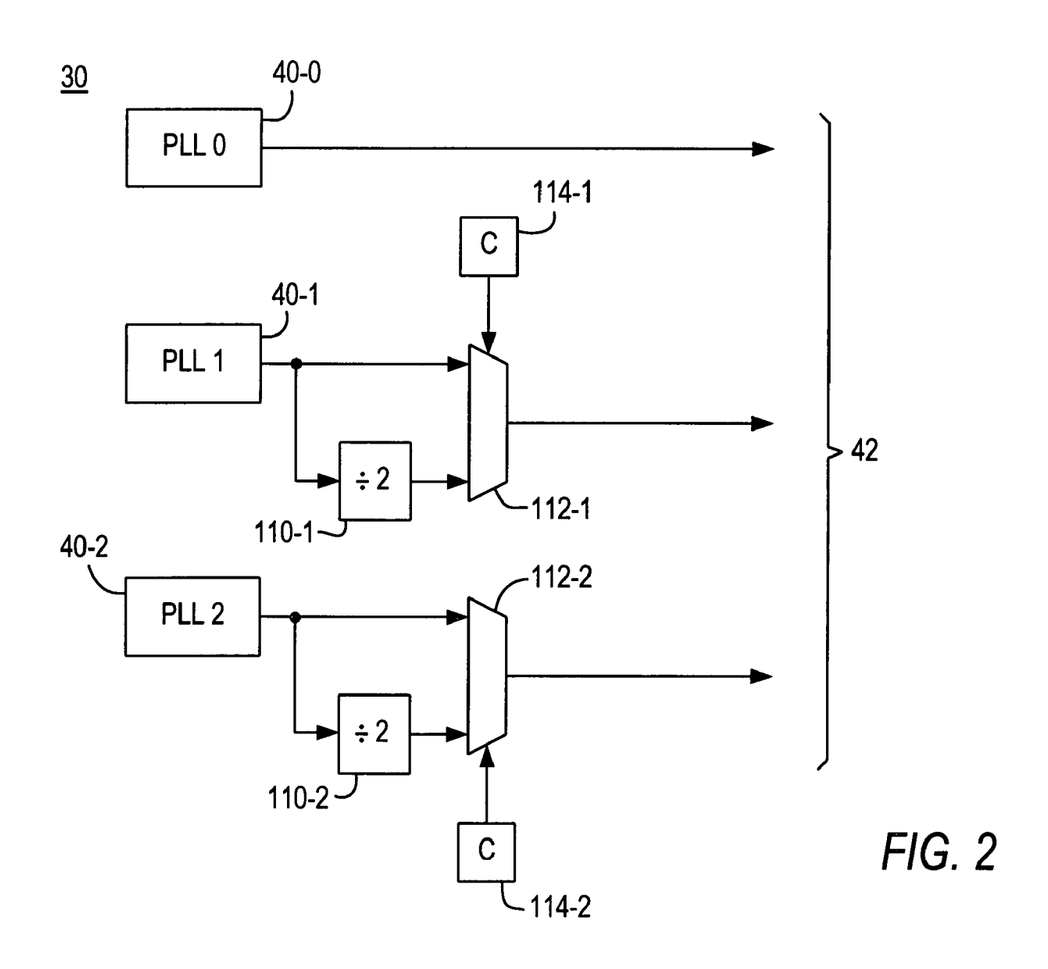
FIG. 2 is a simplified schematic block diagram showing an illustrative embodiment of possible enhancements to FIG. 1 in accordance with the invention.
Figure 7:
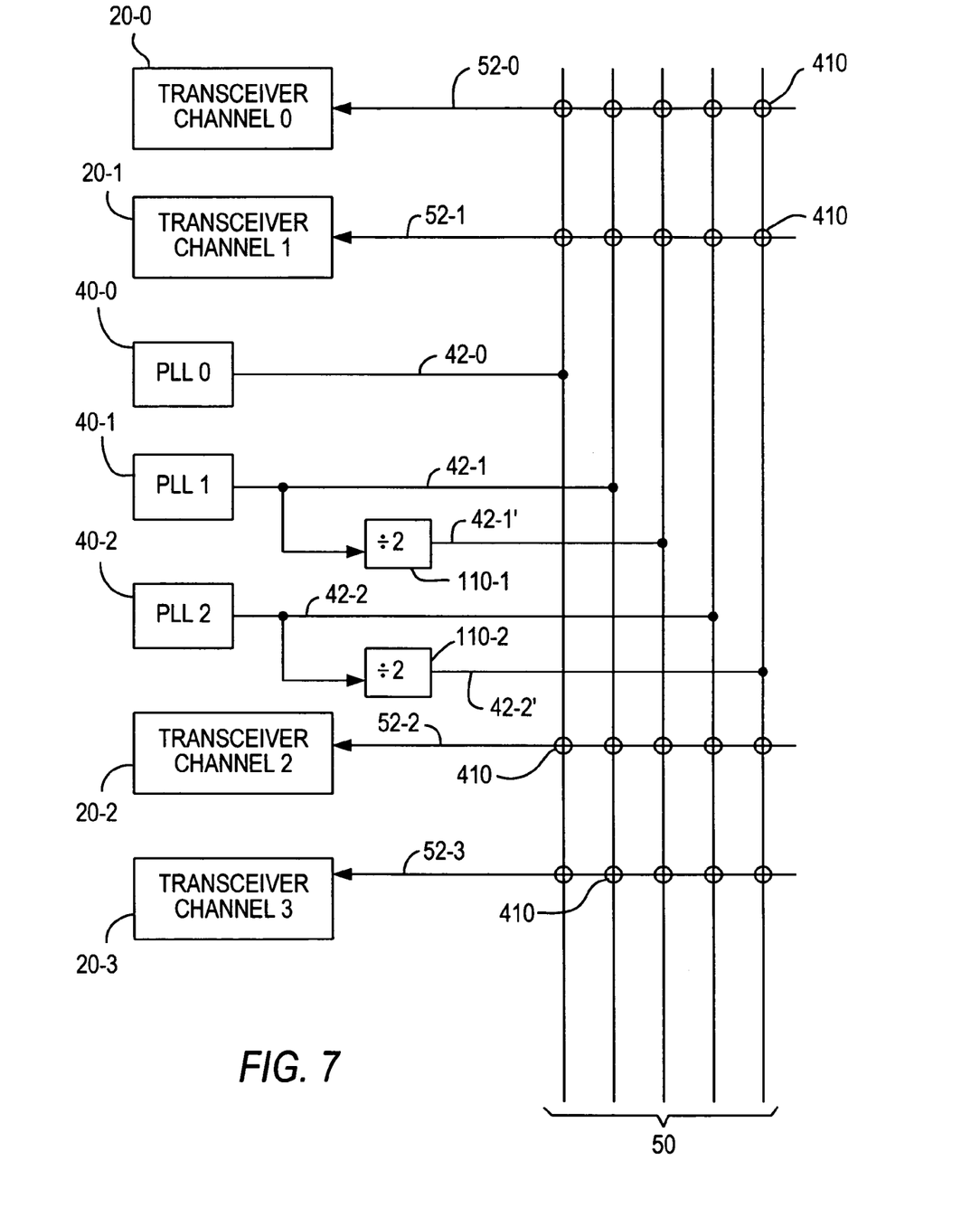
FIG. 7 is a simplified schematic block diagram of an illustrative embodiment of a portion of what is shown in FIG. 1 in accordance with this invention.

Possible further refinements are shown in FIG. 2. In particular, these refinements allow one or more PLLs (especially PLL1 40-1 and PLL2 40-2) to have a post-VCO frequency divider that allows frequency range extension. For example, FIG. 2 shows PLL1 40-1 followed by divide-by-2 frequency divider 110-1 and PLL2 40-2 followed by divide-by-2 frequency divider 110-2. Multiplexer circuitry 112-1 (controlled by control circuitry 114-1) allows divider 110-1 to be either used or bypassed. Similarly, multiplexer circuitry 112-2 (controlled by control circuitry 114-2) allows divider 110-2 to be either used or bypassed. Control circuitries 114 may be programmable elements (e.g., configuration random access memory ("CRAM") bits) or any other desired type of control circuitry. As a possible alternative to separate selection of undivided or divided outputs of PLL1 and PLL2 by circuitry such as 112 and 114, both the undivided and divided outputs can be supplied to clock distribution circuitry 50 (FIG. 1), and all selections of what signals will be used and where those signals will be used can be made by that circuitry 50. (Among other things, FIG. 7 shows this alternative type of construction.) With the addition of frequency divider circuitry 110-1, a PLL1 designed to support 8 Gbps to 10 Gbps can also support 4 Gbps to 5 Gbps. Similarly, with the addition of frequency divider circuitry 110-2, a PLL2 designed to support 9.95 Gbps to 12 Gbps can also support 4.975 Gbps to 6 Gbps.

Each divide-by-two factor improves observed phase noise by approximately 6 dB after the divider.

Additional post dividers like those shown in FIG. 2 can be provided if desired. For example, such additional post dividers can be provided to divide frequency by 4, by 8, etc. On the other hand, this may not be necessary because PLL0 40-0 can provide reasonable jitter performance below 4 Gbps, and can also cover the frequency hole between 6 Gbps and 8 Gbps not covered by PLL1 and PLL2 and their frequency dividers 110. Accordingly, PLL0 40-0 provides flexibility and wide range but perhaps, not optimal jitter, and PLL1 and PLL2 are optimized for jitter in their somewhat narrower regions of operation. Especially for LC-based PLLs, narrow banding is desirable to provide optimal phase noise.

Figure 3:
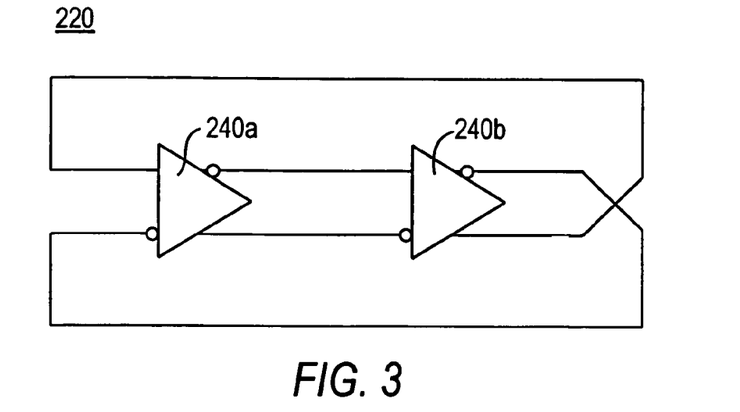
FIG. 3 is a simplified block diagram of an illustrative embodiment of circuitry that can be used in components of the FIG. 1 and FIG. 2 circuitry.
Figure 4:
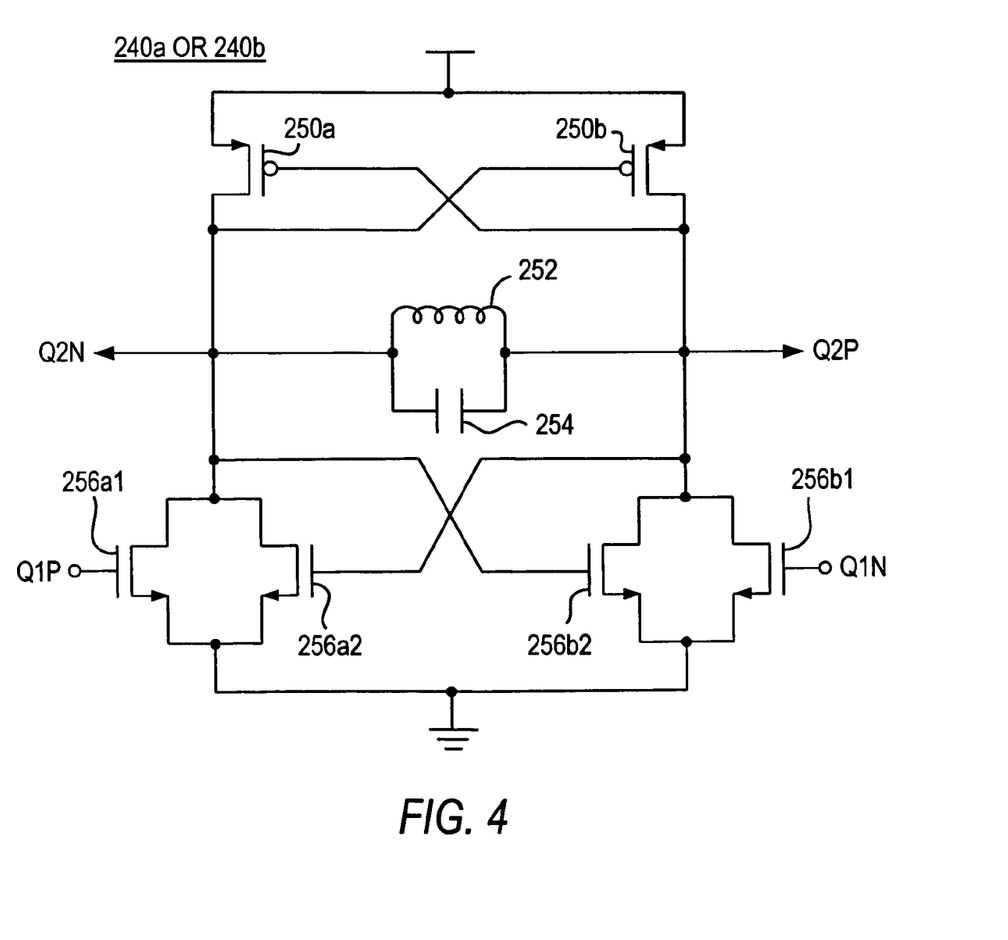
FIG. 4 is a simplified schematic diagram of an illustrative embodiment of a representative component of the FIG. 3 circuitry.
Figure 5:
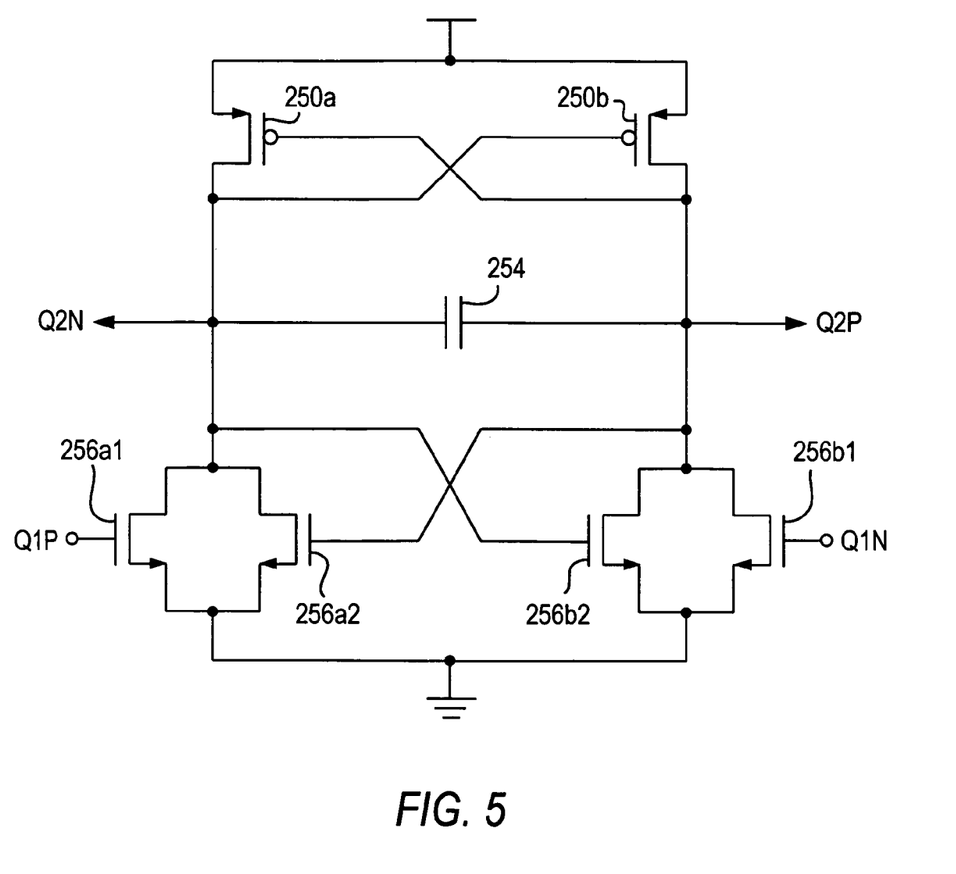
FIG. 5 is a simplified schematic diagram of another illustrative embodiment of a representative component of the FIG. 3 circuitry.

An illustrative form of VCO circuitry 220 that can be used in any of PLL circuits 40 in FIGS. 1 and 2 is shown in FIG. 3. VCO circuitry 220 includes a two-stage coupled quadrature oscillator 240a/240b. Each of components 240 can be constructed either as shown in FIG. 4 (in which case circuitry 220 may be described as LC tank oscillator circuitry), or as shown in FIG. 5 (in which case circuitry 220 may be described as ring oscillator circuitry). The difference between FIGS. 4 and 5 is the presence of inductor 252 in FIG. 4 and the omission of that circuit element from FIG. 5.

To briefly describe FIG. 4, representative stage 240 includes PMOS transistors 250a and 250b, inductor 252, capacitor 254, and NMOS transistors 256a1, 256a2, 256b1, and 256b2. Input Q1P is applied to the gate of transistor 256a1. Input Q1N is applied to the gate of transistor 256b1. Output Q2N is connected to a node at one "end" of the LC tank circuit 252/254. Output Q2P is connected to a node at the other "end" of the LC tank circuit. For controlling the frequency of circuitry 220, a control voltage (VCTRL) may be used to control either a variable capacitor 254 or a variable current source (not shown) connected between the VCO and supply (drains of transistors 250a and 250b) or ground (sources of transistors 256a2 and 256b2).

As has been said, the alternative shown in FIG. 5 is constructed and operates generally similarly to FIG. 4, albeit without inductor 252. Of course, elements may also be sized differently between FIG. 4 and FIG. 5 to help give PLLs that are constructed using these different VCO components different frequency operating ranges as desired.

It will be understood that what is shown in FIGS. 3-5 is only illustrative, and that other constructions may be used for any or all of PLLs 40 in FIGS. 1 and 2 if desired.

To briefly recapitulate what is shown and described above, this architecture can cover continuously a wide data range with optimal jitter performance at various key points, per industry-available standards. In addition, this approach allows re-use of circuitry that has been developed as the architecture is migrated to widen the data range. For example, if it is desired to extend the upper limit of the data range, this can be done by adding another higher-end PLL (e.g., a PLL3, which would have reference number 40-3 in FIGS. 1 and 2), and not redesigning the whole wide tuning range.

Figure 6:
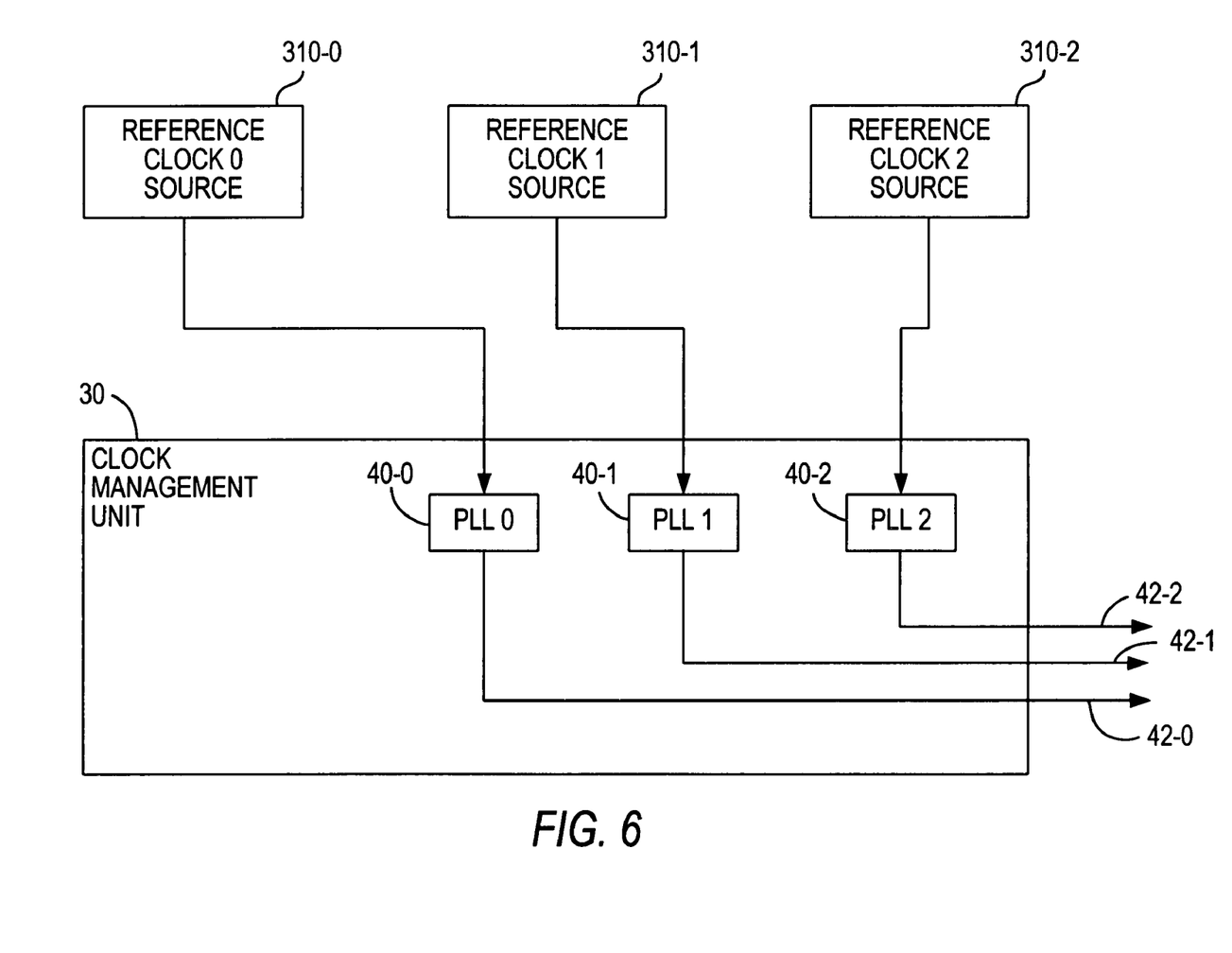
FIG. 6 is a simplified block diagram of an illustrative embodiment of possible further enhancements to the FIG. 1 and FIG. 2 circuitry in accordance with the invention.

Another possible feature of the invention is illustrated by FIG. 6. This is a reference clock scheme that is arranged so that each PLL 40 has a dedicated reference clock targeted for a specific data rate range. For example, PLL0 40-0 can get its reference clock signal from reference clock 0 source 310-0. PLL1 40-1 can get its reference clock signal from reference clock 1 source 310-1. PLL2 40-2 can get its reference clock signal from reference clock 2 source 310-2. In a case in which PLL0 is intended to cover a wide frequency range from about 622 Mbps to about 12 Gbps, reference clock 0 is suitable for use by such a PLL. Continuing with that example, if PLL1 is focused on the range from about 8 Gbps to about 10 Gbps, reference clock 1 is suitable for a PLL with that focus. And if PLL2 is focused on the range from about 9.95 Gbps to about 12 Gbps, reference clock 2 is suitable for use by a PLL with that focus.

An illustrative embodiment of clock distribution circuitry 50 is shown in more detail in FIG. 7. Circuitry 50 conveys the output signals 42 of CMU 30 to the vicinity of each of transceivers 20. Selection circuitry 410 adjacent to each transceiver 20 allows any one (or more) of these signals to be selected for application to that transceiver. It will be apparent that this arrangement allows any output 42 of CMU 30 to be applied to any transceiver 20. Different transceivers 20 can receive the same or different ones of outputs 42 in any of many different combinations.

Figure 8:
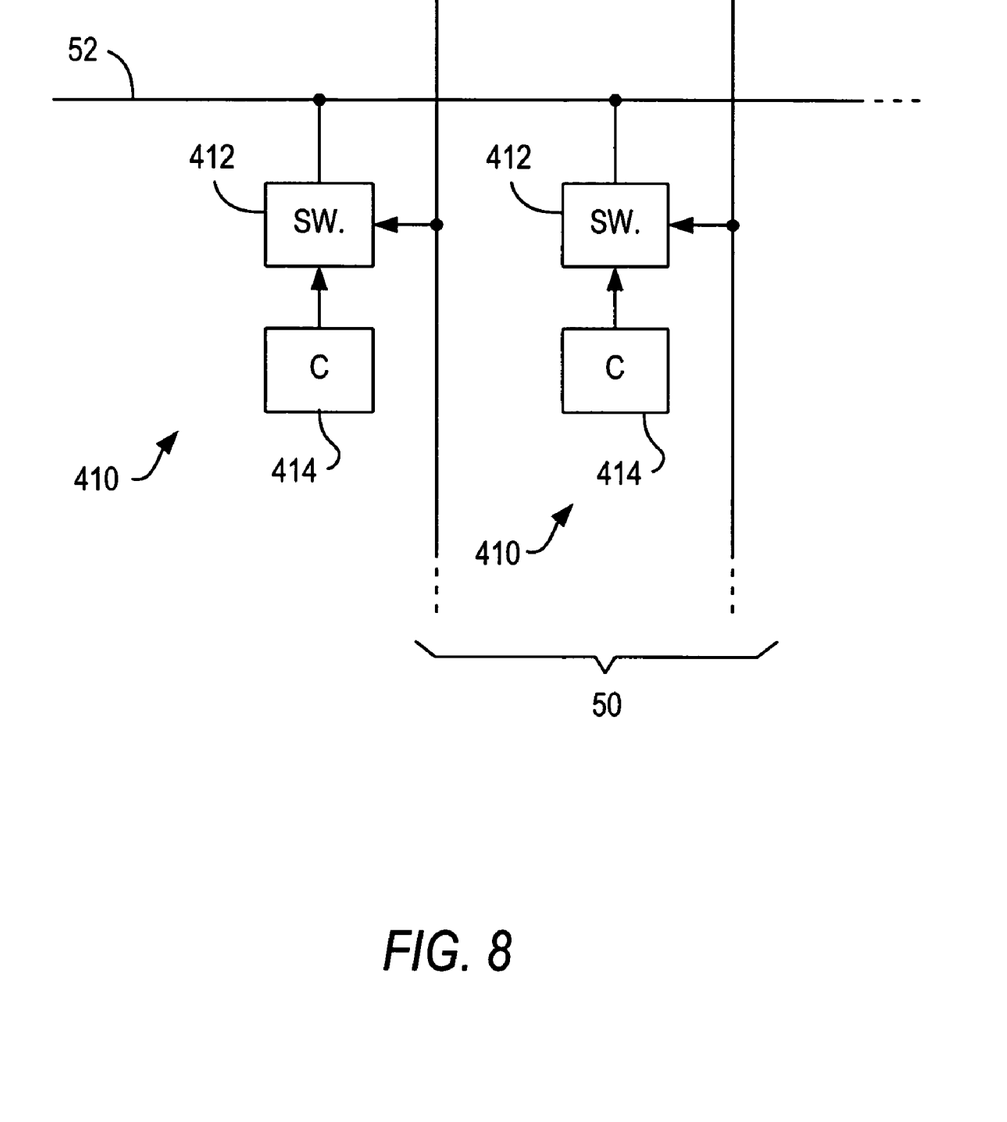
FIG. 8 is a simplified schematic block diagram of an illustrative embodiment of a representative portion of what is shown in FIG. 7 in accordance with the invention.

An illustrative embodiment of a representative portion of the selection circuitry of FIG. 7 is shown in FIG. 8. If it is desired to connect one of the vertical conductors in FIG. 8 to the depicted representative horizontal conductor 52, the switch 412 (e.g., a transistor) between those conductors can be closed by the associated control circuitry 414. Control circuitry 414 can be circuitry of any type described above for elements 114 in FIG. 2.

Figure 9:
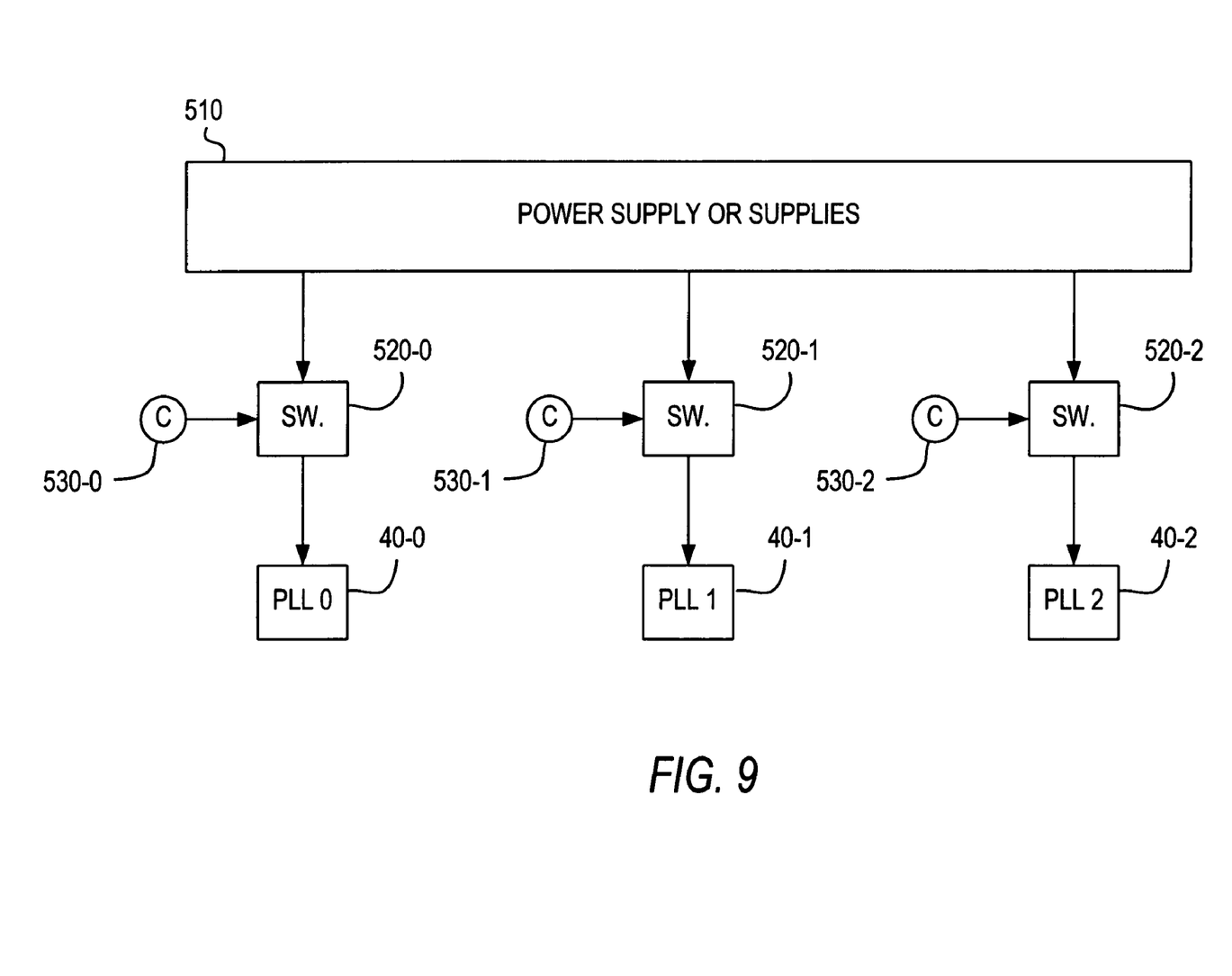
FIG. 9 is a simplified schematic block diagram of an illustrative embodiment of a further possible feature of the invention.

FIG. 9 shows a possible further feature of the invention, which permits power to a PLL 40 that is not in use to be turned off. In the illustrative embodiment shown in FIG. 9, power from power supply(ies) 510 can be supplied to PLL0 40-0 through switch (e.g., a transistor) 520-0. Switch 520-0 can be turned on or off by a signal from control element 530-0. Control element 530-0 can be similar to any other control element shown and described herein (e.g., any of control elements 114 in FIG. 2). In particular, control element 530-0 may be a programmable element such as a configuration RAM bit or cell. In that way the circuitry can be made programmable with respect to whether power to PLL0 40-0 is turned on or off. The same arrangement is shown for PLL1 40-1 and PLL2 40-2. Thus switch 520-1 turns power to PLL1 on or off, depending on the state of control element 530-1. Similarly, switch 520-2 turns power to PLL2 on or off, depending on the state of control element 530-2. The advantages of being able to turn off power to a PLL 40 that is not in use in a particular application of the device are described above in the Summary section of this specification.

Figure 10:
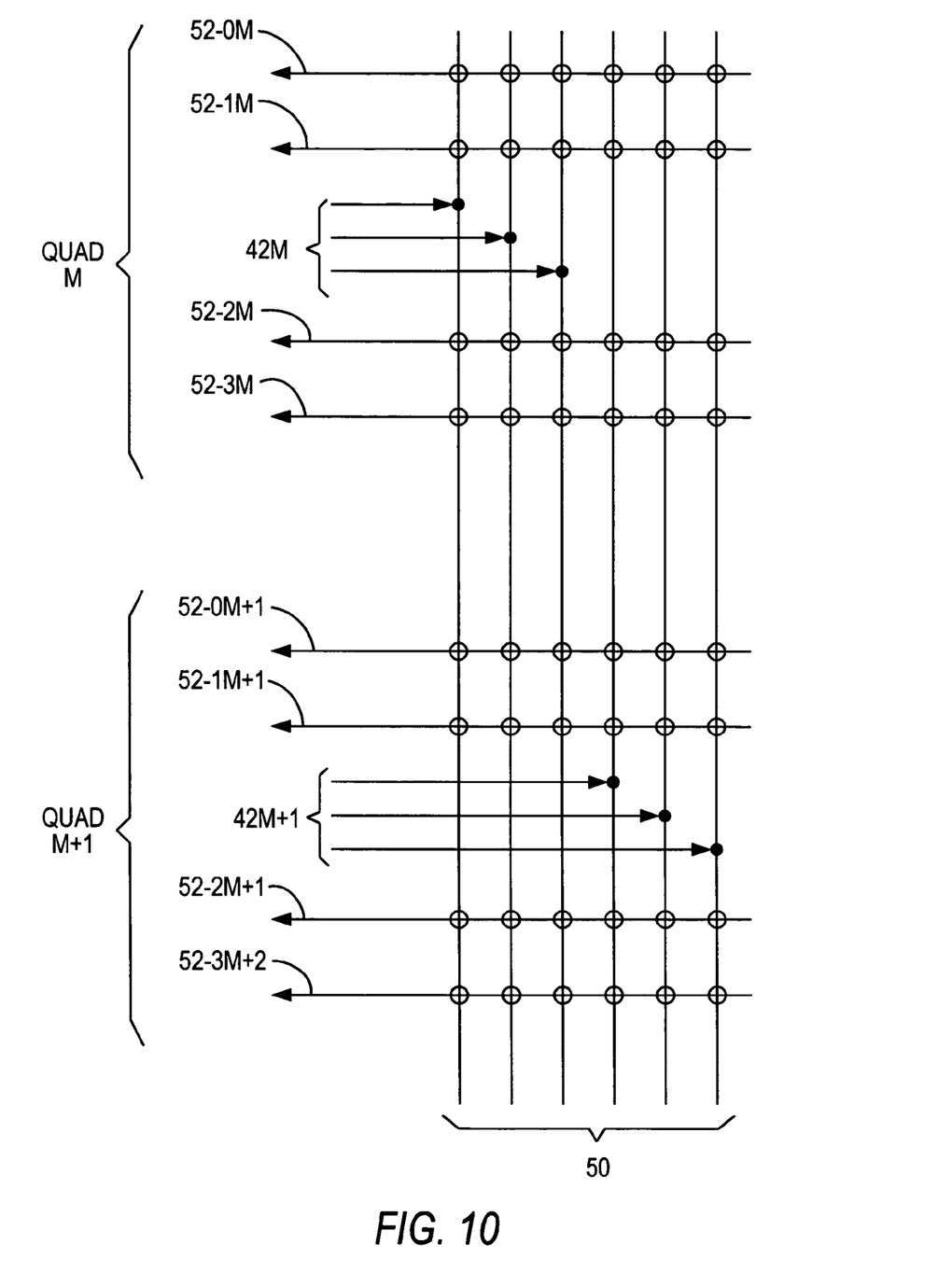
FIG. 10 is a simplified schematic diagram of an illustrative embodiment of another possible feature of the invention.

FIG. 10 illustrates the point that, if desired, the circuitry can be configured so that PLL output signals 42 from one quad can be used not only by the channels 20 in that quad, but also by the channels 20 in one or more other quads. In the illustrative embodiment shown in FIG. 10, clock distribution circuitry 50 allows the output signal 42M any PLL 40 in quad M to be used by any channel 20 in either quad M or quad M+1. Similarly, circuitry 50 allows the output signal 42M+1 of any PLL 40 in quad M+1 to be used by any channel 20 in either quad M+1 or quad M. This type of circuit arrangement allows the PLLs of one quad to be borrowed by another quad, increasing the flexibility of the circuitry. The idea illustrated by FIG. 10 is not limited to two quads, but can be extended to any desired number of quads.

It will be understood that the foregoing is only illustrative of the principles of the invention, and that various modifications can be made by those skilled in the art without departing from the scope and spirit of the invention. For example, the use of three PLLs 40 is only illustrative, and a different plural number of PLLs can be used instead if desired. As another example of modifications within the scope of the invention, the particular frequencies and frequency ranges mentioned herein are only illustrative, and the invention can be applied to other frequencies and frequency ranges if desired. These other frequencies and frequency ranges can be higher and/or lower than those mentioned herein, and/or the frequency ranges to which the invention is applied can be wider and/or narrower than those mentioned herein.

The invention claimed is:

1. A phase-locked loop (PLL) circuitry comprising:
   a first PLL circuit operable at substantially any frequency in a first relatively wide range of frequencies;
   a second PLL circuit operable at substantially any frequency in a second relatively narrow range of frequencies, the second range being included within the first range;
   frequency divider circuitry for dividing frequency of an output signal of the second PLL circuit; and
   routing circuitry for selecting either an output signal of the first PLL circuit, the output signal of the second PLL circuit, or an output signal of the frequency divider circuitry.

2. The circuitry defined in claim 1 further comprising:
   a third PLL circuit operable at substantially any frequency in a third relatively narrow range of frequencies, the third range being included within the first range.

3. The circuitry defined in claim 2 wherein the third range is at least partly separate from the second range.

4. The circuitry defined in claim 1 wherein the frequency divider circuitry divides the frequency of the output signal of the second PLL circuit by 2.

5. The circuitry defined in claim 1 wherein the frequency divider circuitry divides the frequency of the output signal of the second PLL circuit by 4.

6. The circuitry defined in claim 1 wherein the frequency divider circuitry divides the frequency of the output signal of the second PLL circuit by 8.

7. The circuitry defined in claim 1 further comprising:
   transceiver circuitry; and wherein the routing circuitry allows either the output signal of the first PLL circuit or the output signal of the second PLL circuit to be selected for use by the transceiver circuitry.

8. The circuitry defined in claim 1 further comprising:
   first and second reference clock signal sources for the first and second PLL circuits, respectively.

9. The circuitry defined in claim 8 wherein the first and second reference clock signal sources have respective different first and second frequencies.

10. The circuitry defined in claim 1 wherein the first range is from about 622 Mbps to about 12 Gbps, and wherein the second range is from about 8 Gbps to about 10 Gbps.

11. The circuitry defined in claim 2 wherein the first range is from about 622 Mbps to about 12 Gbps, wherein the second range is from about 8 Gbps to about 10 Gbps, and wherein the third range is from about 9.95 Gbps to about 12 Gbps.

12. The circuitry defined in claim 1 further comprising:
   power supply circuitry for at least one of the PLL circuits; and
   control circuitry for selectively applying power from the power supply circuitry to the at least one of the PLL circuits.

13. The circuitry defined in claim 12 wherein the control circuitry is programmable with respect to whether or not it applies power from the power supply circuitry to the at least one of the PLL circuits.

14. A circuitry comprising:
   a plurality of transceiver channels;
   a plurality of phase-locked loop (PLL) circuits, each of which is operable at substantially any frequency within a range of frequencies that is respectively associated with that PLL circuit; and
   routing circuitry for selectively routing a signal from each of the PLL circuits to any of the transceiver channels, wherein the plurality of PLL circuits includes at least first and second PLL circuits and wherein the first PLL circuit includes ring-based voltage-controlled oscillator (VCO) circuitry, and wherein the second PLL circuit includes LC-tank-oscillator-based VCO circuitry.

15. The circuitry defined in claim 14 wherein the routing circuitry is programmable to select the routing.

16. The circuitry defined in claim 14 wherein the range of the second PLL circuit is within the range of the first PLL circuit.

17. A phase-locked loop (PLL) circuitry comprising:
a first PLL circuit that includes ring-based voltage-controlled oscillator VCO circuitry and that is operable at substantially any frequency in a first relatively wide range of frequencies;
a second PLL circuit that includes LC-tank-oscillator-based VCO circuitry and that is operable at substantially any frequency in a second relatively narrow range of frequencies, the second range being included in the first range near an upper end of the first range; and
routing circuitry for selecting any of an output signal of the first PLL circuit and an output signal of the second PLL circuit.

18. The circuitry defined in claim 17 further comprising:
frequency divider circuitry for dividing frequency of an output signal of the second PLL circuit.

19. The circuitry defined in claim 18 wherein the frequency divider circuitry divides frequency by 2.

20. The circuitry defined in claim 19 wherein the routing circuitry selects any of the output signal of the first PLL circuit, an output signal of the second PLL circuit, or an output signal of the frequency divider circuitry for use.

21. The circuitry defined in claim 20 further comprising:
transceiver circuitry; and wherein the routing circuitry applies the signal selected for use to the transceiver circuitry.

22. The circuitry defined in claim 21 wherein the transceiver circuitry is one of a plurality of transceiver circuitries; and
wherein the routing circuitry allows selection of different ones of the signals for use by different ones of the transceivers.

23. A circuitry comprising:
a plurality of transceiver channels;
first, second, and third phase-locked loop (PLL) circuits, the first PLL circuit being operable at substantially any frequency in a first relatively wide range of frequencies, the second PLL circuit being operable at substantially any frequency in a second relatively narrow range of frequencies that is within the first range, and the third PLL circuit being operable at substantially any frequency in a third relatively narrow range of frequencies that is also within the first range but that is different than the second range; and
routing circuitry for allowing an output signal of any of the PLL circuits to be applied to any of the transceiver channels.

24. The circuitry defined in claim 23 wherein the routing circuitry is programmable with respect to how it selects a signal for application to a transceiver channel.

\* \* \* \* \*